Figure 1:
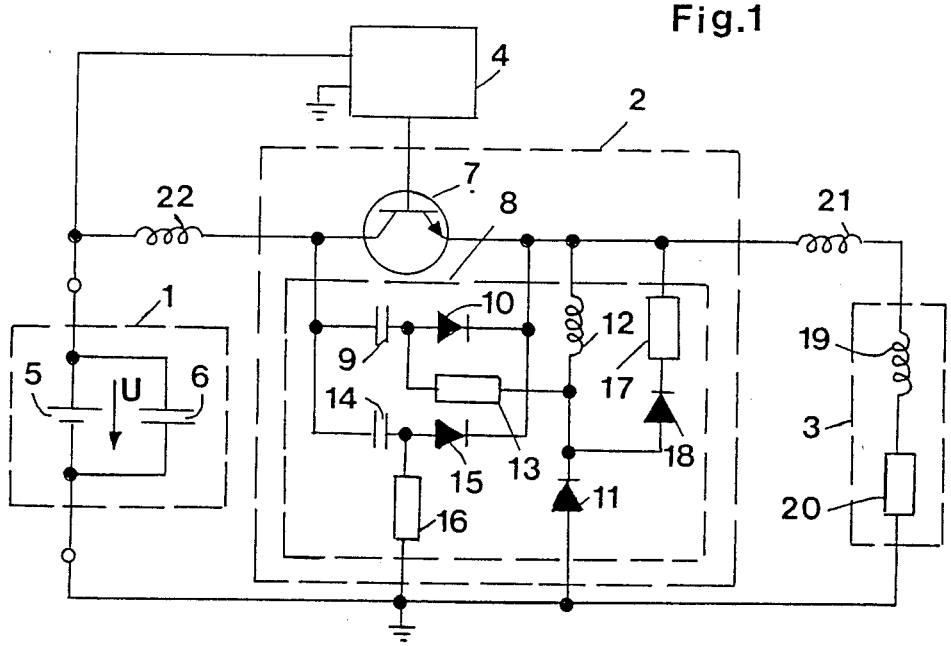

United States Patent [19]

Knudsen

[11] Patent Number: 4,633,094
[45] Date of Patent: Dec. 30, 1986

[54] ELECTRONIC SWITCHING APPARATUS
[75] Inventor: Ivan Knudsen, Bjerringbro, Denmark
[73] Assignee: Danfoss A/S, Nordborg, Denmark
[21] Appl. No.: 763,050
[22] Filed: Aug. 6, 1985
[30] Foreign Application Priority Data
Aug. 10, 1984 [DE] Fed. Rep. of Germany ....... 3429488
[51] Int. Cl.⁴ .................... H01H 3/26; H02M 1/18; G05F 1/56
[52] U.S. Cl. .................... 307/140; 363/56; 323/287; 307/240; 307/252 M
[58] Field of Search .................... 323/285, 286, 287; 318/139; 363/124, 138, 56, 131, 132; 307/131, 139, 140, 141, 141.4, 240, 248, 252 M, 597, 282

[56] References Cited

U.S. PATENT DOCUMENTS

| | | | |
|---|---|---|---|
| 3,577,065 | 5/1971 | Putzrath et al. | 323/287 |
| 3,626,277 | 12/1971 | Munson | 323/287 |
| 3,736,495 | 5/1973 | Calkin et al. | 323/286 |
| 3,919,622 | 11/1975 | Ainema et al. | 307/252 M X |
| 4,167,776 | 9/1979 | Nygard | 363/56 |
| 4,363,067 | 12/1982 | Radomski | 307/240 X |
| 4,378,586 | 3/1983 | Bete | 363/56 |
| 4,566,051 | 1/1986 | Komulainen | 363/56 X |

FOREIGN PATENT DOCUMENTS

| | | | |
|---|---|---|---|
| 2336092 | 6/1975 | Fed. Rep. of Germany | 323/287 |
| 661531 | 5/1979 | U.S.S.R. | 323/287 |

Primary Examiner—William M. Shoop, Jr.
Assistant Examiner—Sharon D. Logan
Attorney, Agent, or Firm—Wayne B. Easton

[57] ABSTRACT

The invention relates to a changeover discharge circuit for an electronic switching circuit of the type having a semiconductor switching element in series with a DC source and an inductive load. Initiation of the discharge current of a discharge capacitor is delayed upon the switching on of the switching element until the substantial termination of the load current by a commutation choke coil and a recovery diode in shunt with the load.

6 Claims, 2 Drawing Figures

ELECTRONIC SWITCHING APPARATUS

The invention relates to an electronic switching apparatus comprising at least one semiconductor operated as a switching element for alternately switching on and off an inductive load fed from a DC voltage source and comprising a change-over discharge circuit having a first capacitor in series with a first diode parallel to the switching path of the switching element, so that the diode and switching element have the same pass direction, and a discharge resistor for the capacitor, and comprising a recovery diode which is preferably parallel to the load.

In a known switching apparatus of this kind (DE-AS No. 26 32 381), the switching element is a transistor. When the transistor is switched on, the capacitor discharges through the transistor and the discharge resistor in series with the capacitor. When the transistor is then switched off again, the capacitor is charged up to the voltage of the DC voltage source by way of the first diode which is likewise in series therewith. This ensures that the collector-emitter voltage of the transistor will not suddenly rise up to the DC operating voltage of the load before the collector-emitter current has dropped off. This leads to a reduction in the energy loss of the transistor when switching off. At the end of the switching-off step, an overvoltage can nevertheless occur at the transistor if the connection between the switching apparatus and the DC voltage source and/or the DC voltage source itself have a high self-inductance. Such an overvoltage is not desired because it requires a transistor which can withstand a correspondingly higher load. Since this overvoltage is substantially proportional to the square root of the ratio of self-inductance to capacitance of the change-over discharge circuit, the capacitance of the capacitor could be selected to be higher to reduce the overvoltage. However, this would lead to the storage of correspondingly more energy in the capacitor, resulting in a higher loss when the capacitor is discharged by way of the discharge resistor, not only in the discharge resistor but also in the transistor through which the discharge current passes.

The invention is based on the problem of providing a switching apparatus of the aforementioned kind, in which the switching element is not overloaded and the efficiency is as high as possible.

According to the invention, this problem is solved in that initiation of the discharge current of the first capacitor is delayed until the switching step of the switching element and commutation of the load current from the recovery diode to the switching element has substantially terminated.

In this way, the switching-on losses of the switching element are reduced and overloading is avoided.

This can be achieved particularly easily in that at least one commutation choke coil is in series with the recovery diode and the discharge resistor is connected on the one hand between the commutation choke coil and the recovery diode and on the other hand between the first capacitor and the first diode. In this arrangement, the commutation choke coil on the one hand ensures that, when a recovery current still flows through the recovery diode parallel to the load when the switching element is switched on, the current flowing through the switching element cannot flow through the recovery diode in the blocking direction during the blocking delay period of the recovery diode which, without the commutation choke coil, could lead to considerable overloading of the switching element during the blocking delay period of the recovery diode, and on the other hand ensures that the capacitor of the change-over discharge circuit will be discharged only when the recovery diode is blocked, i.e. when the recovery current of the load flowing through the recovery diode has decayed. By reason of the delay in the decay of the recovery current as brought about by the commutation choke coil, therefore, the discharging step of the capacitor is likewise delayed and consequently the switching element is not additionally loaded by the discharge current of the capacitor immediately upon switching on.

Parallel to the switching path of the switching element there may be a further series circuit consisting of a second capacitor and a second diode, and the second capacitor may always be kept charged by a charging voltage source at least up to a predetermined voltage and, after the switching element has been switched off, discharged again down to this voltage. If, by reason of the self-inductances during switching off of the switching element a voltage occurs at the switching element exceeding the charging voltage of the second capacitor, the second diode will become conductive so that the second capacitor is practically connected parallel to the first capacitor and the total capacitance of the change-over discharge circuit will increase correspondingly. This results in a correspondingly lower over-voltage because the latter decreases with an increase in the capacitance. Because of the consequently reduced charging voltage of the first capacitor, the energy loss of the first discharge resistor is also less. Further, since the second capacitor is never completely discharged but retains the voltage of the charging voltage source, only the over-voltage needs to be reduced at the second capacitor. Consequently, any discharge losses caused by the second capacitor are likewise comparatively low. Further, the capacitance of the first capacitor can be kept to a comparatively low value and the detrimental over-voltage limited without overloading the switching element with the discharge currents.

Preferably, the voltage of the charging voltage source is equal to the operating voltage of the load. In particular, the DC voltage source may constitute the charging voltage source of the second capacitor. In this case, a separate charging voltage source is dispensed with.

The junction between the second capacitor and the second diode may be connected by way of a second resistor to that pole of the DC voltage source which is remote from the switching element. In this case the voltage of the DC voltage source will always be applied to the series circuit consisting of the second capacitor and the second resistor, so that the second capacitor cannot be discharged to below the voltage of the DC voltage source.

To avoid additional losses through a recovery circuit parallel to the commutation choke coil, the energy stored in the commutation choke coil can be utilised for current supply by way of a diode. In this case, the DC voltage source may be connected by way of a third diode to a secondary winding of the commutation choke coil so that the energy of the commutation choke coil is fed back to the DC voltage source. Another possibility is to connect a storage capacitor of current supply means to the cathode of a recovery diode by way of the third diode. This dispenses with a secondary winding for the commutation choke coil.

The energy stored in the commutation choke coil while the first capacitor is discharged is therefore utilised at least partially so that the losses caused by the change-over discharge circuit are also correspondingly reduced.

Figure 2:
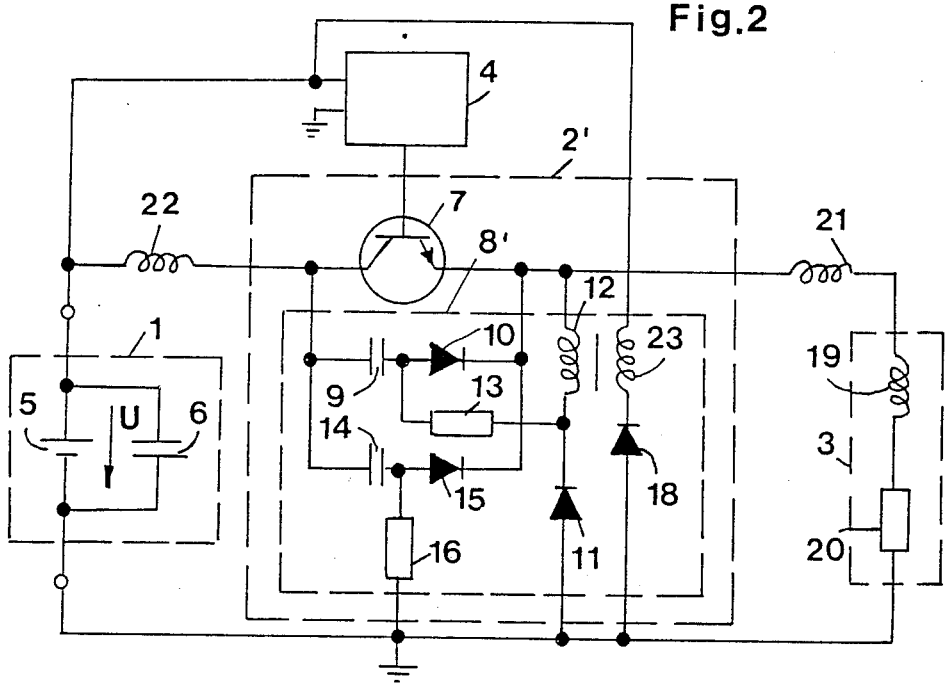

Preferred examples of the invention and its developments will now be described in more detail with reference to the drawing, wherein:

FIG. 1 is a basic circuit diagram of current supply means with switching apparatus according to the invention operated as a chopper, and FIG. 2 is a basic circuit diagram of current supply means with a second example of switching apparatus according to the invention.

The current supply means of FIG. 1 comprise a DC voltage source 1 and a switching apparatus 2 according to the invention, an inductive load 3 being intermittently connected to the DC voltage source 1 by way of the switching apparatus 2. For this purpose, the switching apparatus 2 is periodically switched on and off by control pulses of a control stage 4.

The DC voltage source 1 contains a battery 5 or the like, e.g. a rectifier charged by the AC mains, and a trickle or smoothing capacitor 6. The switching apparatus 2 is disposed between the plus pole (+) of the DC voltage source 1 and the load 3 and contains a controllable switching element 7 in the form of a transistor (possibly a plurality of transistors in Darlington circuit or a thyristor, e.g. a switching off thyristor) and a change-over discharge circuit 8 with a capacitor 9 and a diode 10 which are connected in series and parallel to the switching path of the switching element 6 (the collector emitter path of the transistor). Further, the change-over discharge circuit 8 contains a series circuit consisting of a recovery diode 11 and a commutation choke coil 12 parallel to the load 3. A discharge resistor 13 for the capacitor 9 is connected on the one hand between the capacitor 9 and diode 10 and on the other hand between the recovery diode 11 and the commutation choke coil 12. In addition, parallel to the switching path there is the series circuit of a second capacitor 14 and a second diode 15 of which the junction is connected by way of a second ohmic resistor 16 to that pole of the DC voltage source 1 which is remote from the switching element 7, in this case the minus pole (−). A series circuit consisting of an ohmic resistor 17 and a further recovery diode 18 lies in parallel with the commutation choke coil 12.

The load 3 contains a coil 19, e.g. of an electric motor, in series with an ohmic resistor 20 which may also represent the losses of the coil 19. Between the switching element 7 and load 3, there may also be a smoothing choke coil 21.

The connections between the DC voltage source 1 and the switching apparatus 2 possess self-inductance, represented as a coil 22. This coil 22 may also represent the inductances that may be present in the transformer windings and chokes at DC voltage source 1 as well as their control inductances.

The control stage 4 is likewise fed with the operating current from the DC voltage source 1.

The function of the circuit of FIG. 1 will now be described in more detail.

As long as the transistor 7 is switched on, a current will flow to the load 3 through its collector-emitter path. As soon as the control pulse of the control stage 4 keeping the transistor 7 switched on disappears, the current flowing through the collector-emitter path decreases substantially linearly. At the same time, the coil 19 starts to discharge through the recovery diode 11 and the commutation choke coil as well as through the resistor 17 and recovery diode 18. The capacitor 9 was discharged during the switched-on state of the transistor 7 by way of the latter, the commutation choke coil 12 and the resistor 13 and will now become charged up to the operating voltage U by way of the diode 10 and resistor 13. This ensures that the collector-emitter voltage of transistor 7 will increase only gradually and overloading of transistor 7 is prevented so long as the collector-emitter current has not yet decayed. The capacitor 14 is still charged up to the operating voltage U because it is constantly applied to the DC voltage source 1 by way of the resistor 16, so that it cannot be discharged below the operating voltage U by way of the transistor 7 even if the transistor 7 is switched on. The capacitor 14 increases the total capacitance of the change-over discharge circuit 8. This ensures that the voltage at the capacitor 9 and hance at the collector-emitter path of the transistor 7 can likewise not markedly exceed the operating voltage U. Without the capacitor 14, diode 15 and resistor 16, the oscillatory circuit comprising the inductance 22 and capacitor 9 would permit a comparatively high over-voltage to be created at the capacitor 9. This over-voltage could be reduced by increasing the capacitance of the capacitor 9 but in that case a correspondingly larger energy would be stored in the capacitor during each charging step and used up without any purpose in the resistor 13 during discharging. In contrast, the capacitor 14 is recharged by the operating voltage U only to the extent of any over-voltage and discharged down to the operating voltage U again, and it can be shown that the power loss thereby created in the resistor 16 is less than the additional loss caused in the resistor 13 if the components 14 to 16 are omitted and the capacitance of the capacitor 9 is increased by an amount at which the over-voltage has the same low value as when the components 14 to 16 are provided.

After the capacitor 9 has been charged, the transistor 7 is switched on again during the next control pulse of the control stage 4. If the discharge current of the load 3 has not yet decayed up to this stage, i.e. a recovery current still flows through the recovery diode 11, a comparatively high blocking delay current could flow by way of the recovery diode 11 during the blocking delay period of the recovery diode if the commutation choke coil 12 were absent and this current could lead to additional loading and possibly overloading of the transistor 7. The commutation choke coil 12 is therefore provided to suppress such a blocking delay current and ensure correspondingly soft commutation of the load current from the recovery diode 11 to the transistor 7.

Further, the capacitor 9 can discharge only when the discharge current of the load 3 flowing partly through the commutation choke coil 12 has almost or completely decayed, because the discharge current of the capacitor 9 seeks to flow through the commutation choke coil 12 in the opposite direction to the discharge current of the load 3.

This means that the discharge current of the capacitor 9 sets in only when the discharge current of the load 3 flowing through the recovery diode 11 has substantially decayed and the transistor 7 is fully conductive. Overloading of the transistor 7 by an additional discharge current of the capacitor 9 is therefore likewise avoided during its transition from the blocked to the fully conductive state.

As soon as the capacitor 9 has been discharged through the commutation choke coil 12, the energy stored in the commutation choke coil 12 is substantially discharged again through the recovery diode 18 and the resistor 17 because the resistance of the resistor 13 is substantially higher than that of the resistor 17.

The FIG. 2 example differs from that of FIG. 1 merely in that the changeover discharge circuit 8' of the switching apparatus 2' has, instead of the resistor 17, a secondary winding 23 which is magnetically coupled to the commutation choke coil 12 and which is connected to the DC voltage source 1 by way of the diode 18 that now acts as a rectifier, so that the discharge energy of the capacitor 9 is utilised for current supply.

However, it is also possible to transmit the energy of the commutation choke coil directly through a diode into a storage capacitor of which the charge is used substantially alone to energise a circuit, e.g. the control stage 4. In this case, it is merely necessary to ensure initial charging of the storage capacitor by means of a suitable starting circuit upon commencement of operation. Thereafter, the current supply is by the discharge energy of the commutation choke coil.

A plurality of the switching apparatus 2 and 2' could also be used in a multi-phase alternator.

I claim:

1. A changeover discharge circuit for an electronic circuit of the type having a semiconductor switching element in series with a DC source and an inductive load and having means for alternately turning said switching element on and off, said changeover discharge circuit comprising, a first capacitor and a first diode in series relative to each other and together in shunt with said switching element, said first diode having the same pass direction as said switching element, a commutation choke coil and a recovery diode in series relative to each other and in shunt with said inductive load, and a discharge resistor having one side thereof between said first capacitor and said first diode and the other side thereof between said choke coil and said recovery diode, said changeover discharge circuit operating upon the switching on of said switching element to delay the initiation of the discharge of said first capacitor until the commutation of load current in said choke coil has substantially terminated.

2. A changeover discharge circuit according to claim 1 including a second capacitor and a second diode in series relative to each other and in shunt with said switching element, said second diode having the same pass direction as said switching element, said second capacitor being always kept charged by said DC source at least up to a predetermined voltage and is discharged to said predetermined voltage again after said switching element is switched off.

3. A changeover discharge circuit according to claim 2 characterized in that the voltage of said DC source is equal to the operating voltage of said load.

4. A changeover discharge circuit according to claim 2 including a second resistor extending from the junction between said second capacitor and said second diode to the pole of said DC source which is remote from said switching element.

5. A changeover discharge circuit according to claim 2 including a secondary window for said choke coil for utilizing energy stored in said choke coil.

6. A changeover discharge circuit according to claim 5 including a third diode connecting said DC source to said secondary winding.

* * * * *